United States Patent
Tung

(10) Patent No.: US 9,525,424 B2
(45) Date of Patent: Dec. 20, 2016

(54) METHOD FOR ENHANCING TEMPERATURE EFFICIENCY

(71) Applicant: ELITE SEMICONDUCTOR MEMORY TECHNOLOGY INC., Hsinchu (TW)

(72) Inventor: Ming-Sheng Tung, Hsinchu (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 0 days.

(21) Appl. No.: 14/693,219

(22) Filed: Apr. 22, 2015

(65) Prior Publication Data

US 2016/0315624 A1 Oct. 27, 2016

(51) Int. Cl.
| | | |
|---|---|---|
| *H03L 1/00* | (2006.01) |
| *H03L 1/02* | (2006.01) |
| *G05F 1/10* | (2006.01) |
| *H03K 3/03* | (2006.01) |
| *H03K 3/011* | (2006.01) |
| *G05F 1/46* | (2006.01) |

(52) U.S. Cl.
CPC .............. *H03L 1/022* (2013.01); *G05F 1/10* (2013.01); *G05F 1/465* (2013.01); *H03K 3/011* (2013.01); *H03K 3/0315* (2013.01); *H03L 1/026* (2013.01)

(58) Field of Classification Search
CPC ....... H03K 3/011; H03K 3/0315; H03L 1/026; H03L 1/022; G05F 1/10; G05F 1/465
USPC ............ 331/176, 57, 16, 34, 177 R; 327/539
See application file for complete search history.

(56) References Cited

U.S. PATENT DOCUMENTS

| | | | | |
|---|---|---|---|---|
| 7,737,768 | B2* | 6/2010 | Byeon | G05F 1/465 323/313 |
| 2008/0042736 | A1* | 2/2008 | Byeon | G05F 1/465 327/539 |
| 2008/0265860 | A1* | 10/2008 | Dempsey | G05F 3/30 323/314 |
| 2011/0316515 | A1* | 12/2011 | Mitsuda | H03K 3/011 323/314 |
| 2013/0241526 | A1* | 9/2013 | Ozasa | G05F 3/222 323/314 |
| 2015/0116042 | A1* | 4/2015 | Kim | H03K 3/0315 331/57 |

* cited by examiner

*Primary Examiner* — Arnold Kinkead
(74) *Attorney, Agent, or Firm* — Li & Cai Intellectual Property (USA) Office

(57) ABSTRACT

Disclosed is a method for enhancing temperature efficiency, used to enhance a temperature efficiency resulted from temperature changes in regard to an oscillating period of an oscillator. The method for enhancing temperature efficiency comprises the steps as follows: generating a PTAT current by using a bandgap circuit; generating a CTAT current by using a bandgap circuit; generating an output current, wherein the output current equals to PTAT current minus CTAT current; and providing the output current to an oscillator for generating an oscillating frequency.

7 Claims, 3 Drawing Sheets

METHOD FOR ENHANCING TEMPERATURE EFFICIENCY

FIELD

The instant disclosure relates to a method for enhancing temperature efficiency, and more particularly, for a method for enhancing temperature efficiency with respect to the oscillating period of an oscillator.

BACKGROUND

Semi-conductor devices are often used in oscillators for generating clock signals, so as to control the operation of electric devices. In order to let the oscillator circuit function properly, the frequency of the clock signal generated by the oscillator circuit is set within a predetermined range even with an expected temperature change. Generally speaking, for stabilizing the operation of an electric device, it is usually required to reduce the temperature efficiency with respect to the frequency and the period of an oscillator.

However, in a low power operation mode, with a low voltage, it is difficult to compensate for the temperature efficiency. From the opposite point of view, how to apply the temperature efficiency becomes another choice that is worth discussing.

SUMMARY

The disclosed embodiments include a method for enhancing temperature efficiency. The method for enhancing temperature efficiency comprises steps as follows: generating a PTAT (Proportional to Absolute Temperature) current by using a bandgap circuit; generating a CTAT (Complementary to Absolute Temperature) current by using the bandgap circuit; generating an output current, wherein the output current equals to the PTAT current minus the CTAT current; and providing the output current to an oscillator for generating an oscillating frequency.

To sum up, in the method for enhancing temperature efficiency of the instant disclosure, a PTAT current and a CTAT current are generated by a bandgap circuit. After that, an output current is generated, wherein the output current equals to the PTAT current minus the CTAT current. Finally, via providing the output current to an oscillator, the temperature efficiency with respect to the oscillating period of an oscillator is dramatically enhanced. Especially within a low temperature segment, it is shown that the oscillating period of an oscillator will be larger as the temperature gets lower.

For further understanding of the instant disclosure, reference is made to the following detailed description illustrating the embodiments and examples of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings. The following description is going to illustrate a method for enhancing temperature efficiency provided by the instant disclosure with figures; however, it is not restricted by the embodiments below.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the instant disclosure. As used herein, the term "and/or" includes any and all combinations of one or more of the associated listed items.

One Embodiment of the Method for Enhancing Temperature Efficiency

Figure 1:
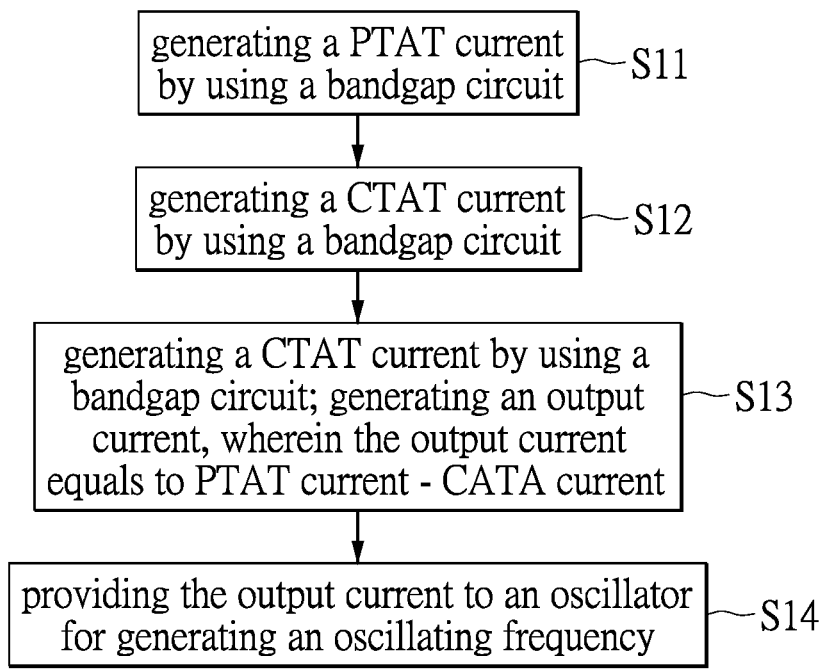
FIG. 1 shows a flow chart of a method for enhancing temperature efficiency with respect to the oscillating period of an oscillator according to an embodiment of the instant disclosure.

Please refer to FIG. 1, FIG. 1 shows a flow chart of a method for enhancing temperature efficiency with respect to the oscillating period of an oscillator according to an embodiment of the instant disclosure. As shown in FIG. 1, in this embodiment, the method for enhancing temperature efficiency with respect to the oscillating period of an oscillator comprises the steps as follows. At the beginning of the method, a PTAT current IPTAT is generated by using a bandgap circuit (Step S11), and a CTAT current ICTAT is generated by using a bandgap circuit (Step S12). After that, an output current IPTAT_N is generated, wherein the output current IPTAT_N equals to the PTAT current IPTAT minus the CTAT current ICTAT (Step S13).

Figure 2A:
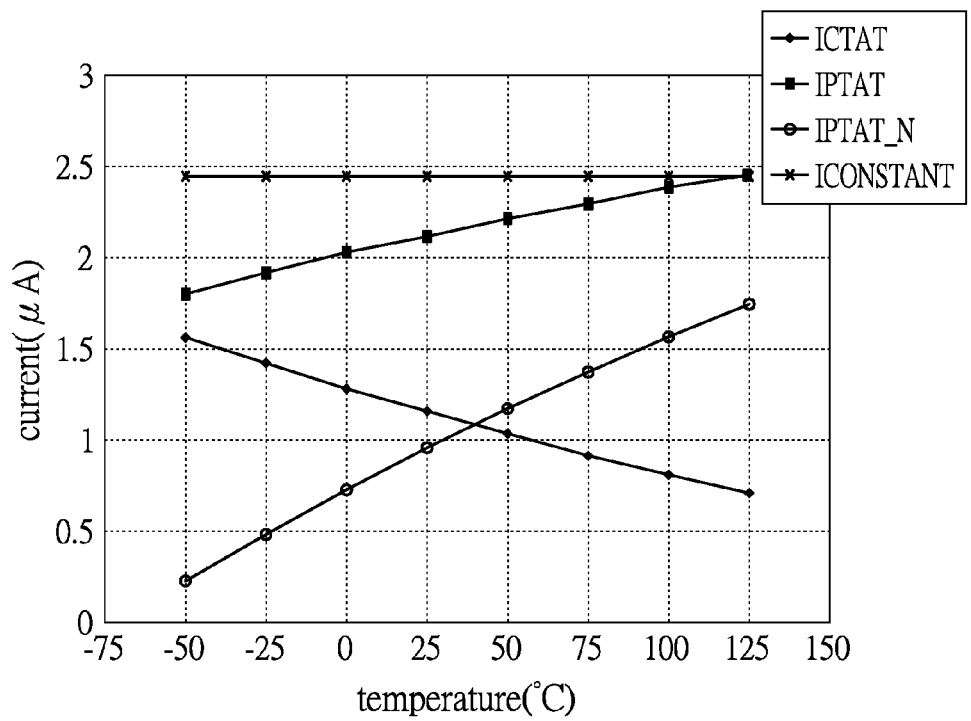
FIG. 2A shows a relation curve of the PTAT current with respect to temperature and a relation curve of the CTAT current with respect to temperature according to an embodiment of the instant disclosure.

Please refer to FIG. 2A, FIG. 2A shows a relation curve of the PTAT current with respect to temperature and a relation curve of the CTAT current with respect to temperature according to an embodiment of the instant disclosure. As shown in FIG. 2A, the CTAT current ICTAT decreases as the temperature increases, and the PATA current IPTAT and the output current IPTAT_N increases as the temperature increases. It is worth noting that, the slope of a relation curve of the output current IPTAT_N with respect to temperature is larger than the slope of a relation curve of the PTAT current IPTAT with respect to temperature. In other words, compared with the PTAT current IPTAT, the temperature efficiency with respect to the output current IPTAT_N is apparently enhanced. From the above, an output current IPTAT_N with enhanced temperature efficiency is generated, wherein the output current IPTAT_N equals to the PTAT current IPTAT minus the CTAT current ICTAT.

Moreover, as shown in FIG. 2A, a sum of the PTAT current IPTAT and the CTAT current ICTAT is a constant current ICONSTANT. In other words, an absolute value of the slope of a relation curve of the PTAT current IPTAT with respect to temperature is equal to or similar with an absolute value of the slope of a relation curve of the CTAT current ICTAT with respect to temperature.

Figure 2B:
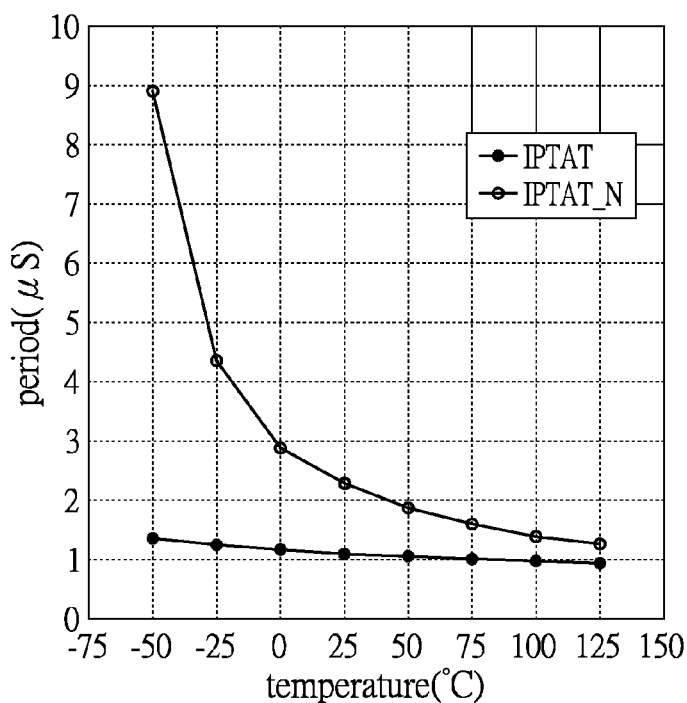
FIG. 2B shows a relation curve of the oscillating period with respect to temperature according to an embodiment of the instant disclosure.

Please again refer to FIG. 1, in this embodiment, the method for enhancing temperature efficiency with respect to the oscillating period of an oscillator comprises: after the output current IPTAT_N is generated, the output current IPTAT_N is provided to an oscillator so as to generate an oscillating frequency (Step S14). Please refer to FIG. 2B, FIG. 2B shows a relation curve of the oscillating period with respect to temperature according to an embodiment of the instant disclosure. As shown in FIG. 2B, after the output current IPTAT_N is provided to the oscillator, the oscillating frequency of the oscillator increases as the temperature increases because the output current IPTAT_N increases as the temperature increases. Therefore, the oscillating period of the oscillator further increases as the temperature increases.

It is worth noting that, if the PTAT current IPTAT and the output current IPTAT_N are respectively provided to the oscillator for generating oscillating frequencies and corresponding oscillating periods $T_{IPTAT}$ and $T_{IPTAT\_N}$, it will be found that the temperature efficiency with respect to the oscillating period $T_{IPTAT\_N}$ is apparently enhanced although the oscillating periods $T_{IPTAT}$ and $T_{IPTAT\_N}$ both decrease as the temperature increases, and are inversely proportional to temperature, as shown in FIG. 2B. Particularly, compared with the oscillating period $T_{IPTAT}$, the temperature efficiency with respect to the $T_{IPTAT\_N}$ increases more within a low temperature segment, which shows a feature that the oscillating period $T_{IPTAT\_N}$ would be larger as the temperature increases. Therefore, the method for enhancing temperature efficiency with respect to the oscillating period of an oscillator in this embodiment is preferably applied to a low power operation mode with low voltage, but it is not limited thereto.

Figure 3:
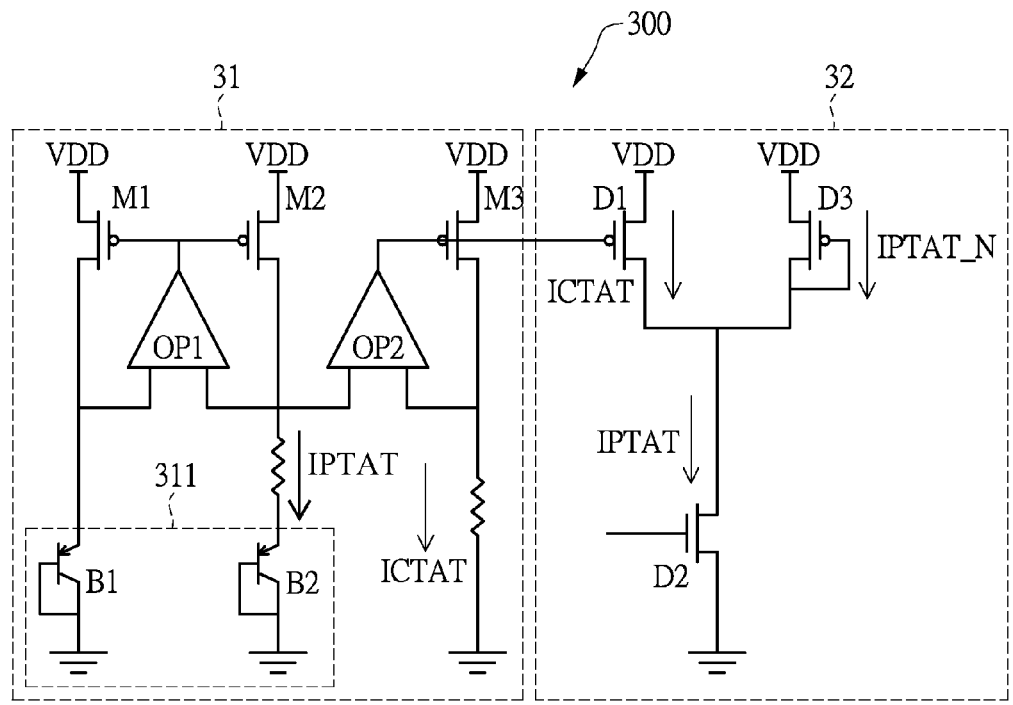
FIG. 3 shows a circuit diagram of a bandgap circuit according to an embodiment of the instant disclosure.
Figure 4:
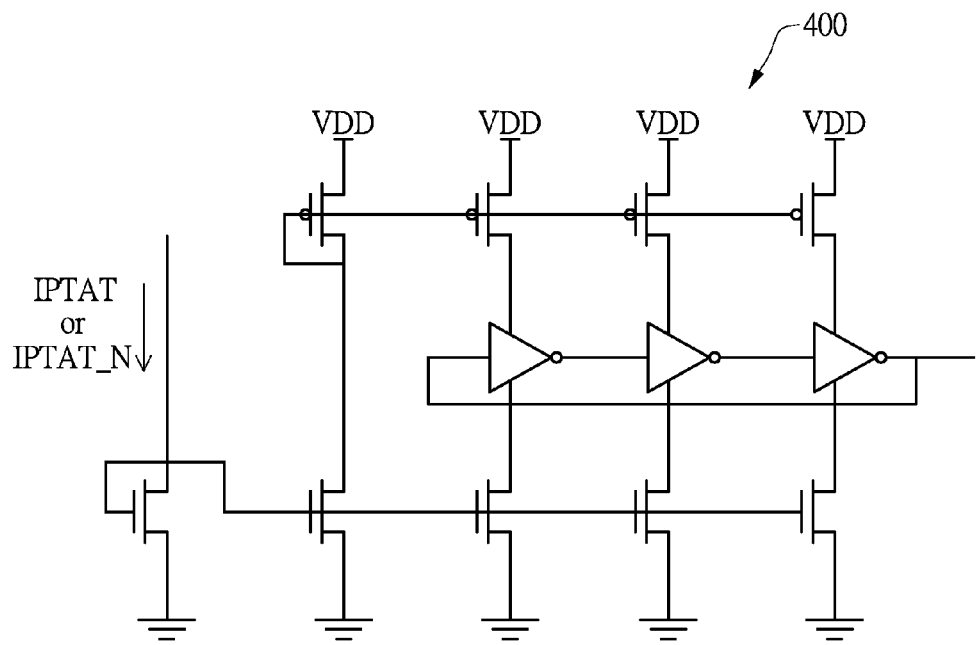
FIG. 4 shows a circuit diagram of an oscillator according to an embodiment of the instant disclosure.

In one embodiment, in the method for enhancing temperature efficiency with respect to the oscillating period of an oscillator provided by the instant disclosure, the circuit diagrams of the bandgap circuit and the oscillator circuit are respectively shown as FIG. 3 and FIG. 4. FIG. 3 shows a circuit diagram of a bandgap circuit according to an embodiment of the instant disclosure, and FIG. 4 shows a circuit diagram of an oscillator according to an embodiment of the instant disclosure.

As shown in FIG. 3, the bandgap circuit 300 comprises a current generating circuit 31 configured to generate a PTAT current IPTAT and a CTAT current ICTAT, and comprises an output circuit 32 connected to the current generating circuit 31. The output circuit 32 comprises a plurality of transistors D1~D3, configured to receive the PTAT current IPTAT and the CTAT current ICTAT so as to generate an output current IPTAT_N. The plurality of transistors D1~D3 in the output circuit 32 may be metal oxide semiconductor transistors, but it is not limited thereto.

Regarding the current generating circuit 31, the current generating circuit 31 comprises a plurality of current mirrors M1~M3, connected to a fixed voltage source VDD, and at least one amplifier (herein, there are two amplifiers OP1 and OP2) connected to a plurality of current mirrors M1~M3, so as to output the PTAT current IPTAT and the CTAT current ICTAT. Moreover, the current generating circuit 31 further comprises a level control unit 311, wherein the level control unit 311 comprises a plurality of transistors B1 and B2, and the transistors B1 and B2 are respectively connected to one of the current mirrors M1~M3 and one of the amplifiers OP1 and OP2 so as to control the level of the PTAT current IPTAT and the CTAT current ICTAT. The plurality of transistors B1 and B2 in the level control unit 311 may be bipolar junction transistors, but it is not limited thereto.

After that, the PTAT current IPTAT and the CTAT current ICTAT generated by the current generating circuit 31 are output to the output circuit 32 so as to generate the output current IPTAT_N, wherein the PTAT current IPTAT the PTAT current IPTAT flows through the current mirror to generate another PTAT current IPTAT flowing into the transistor D2. Moreover, the output current IPTAT_N equals to the PTAT current IPTAT minus the CTAT current ICTAT.

Finally, the output current IPTAT_N that equals to the PTAT current IPTAT minus the CTAT current ICTAT is provided to an oscillator circuit 400 in the embodiment shown in FIG. 4, so as to generate an oscillating frequency and a corresponding oscillating period $T_{IPTAT\_N}$ thereof. As shown in FIG. 4, the oscillator circuit 400 comprises a plurality of transistors and a plurality of amplifiers. After the output current IPTAT_N is output to the oscillator circuit 400, the oscillating frequency of the oscillator circuit 400 will change as the temperature changes. It should be noted that, an artisan of ordinary skill in the art will appreciate the operation of the oscillator circuit 400, thus there is no need to go into details.

It is worth noting that, the oscillating period $T_{IPTAT\_N}$ of the oscillator circuit 400 will decrease as the temperature increases and will be inversely proportional to the temperature. In addition, within a low temperature segment, the temperature efficiency with respect to the oscillating period $T_{IPTAT\_N}$ will dramatically increase. In other words, via the method for enhancing temperature efficiency with respect to the oscillating period of an oscillator in this embodiment, the temperature efficiency with respect to the oscillating period $T_{IPTAT\_N}$ will be increasingly raised, which further shows a feature that the oscillating period $T_{IPTAT\_N}$ of the oscillator circuit 400 will be larger as the temperature gets lower.

It should be noted that, the bandgap circuit and the oscillator circuit shown in FIG. 3 and FIG. 4 are just for explaining the method for enhancing temperature efficiency with respect to the oscillating period of an oscillator provided by the instant disclosure, and thus the structures of the bandgap circuit and the oscillator circuit are not restricted herein.

To sum up, in the method for enhancing temperature efficiency of the instant disclosure, a PTAT current and a CTAT current are generated by a bandgap circuit. After that, an output current is generated, wherein the output current equals to the PTAT current minus the CTAT current. Finally, via providing the output current to an oscillator, the temperature efficiency with respect to the oscillating period of an oscillator will be dramatically enhanced. Especially within a low temperature segment, it is shown that the oscillating period of an oscillator will be larger as the temperature gets lower.

The descriptions illustrated supra set forth simply the embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A method for enhancing temperature efficiency, comprising:

generating a PTAT current by using a bandgap circuit;
generating a CTAT current by using the bandgap circuit;
generating an output current, wherein the output current equals to the PTAT current minus the CTAT current; and
providing the output current to an oscillator for generating an oscillating frequency;
wherein the bandgap circuit comprises:
a current generating circuit, used to generate the PTAT current and the CTAT current; and
an output circuit, comprising a plurality of transistors, and connected to the current generating circuit for receiving the PTAT current and the CTAT current so as to generate the output current;
wherein the current generating circuit comprises:
a plurality of current mirrors, connected to a fixed voltage source; and
at least one amplifier, connected to a current mirror, configured to output the PTAT current and the CTAT current;
wherein the current generating circuit further comprises a level control unit, wherein the level control unit comprises a plurality of transistors, and each of the transistors is connected to one of the current mirrors and one of the amplifiers so as to control levels of the PTAT current and the CTAT current.

2. The method according to claim 1, wherein a slope of a relation curve of the output current with respect to temperature is larger than a slope of a relation curve of the PTAT current with respect to temperature.

3. The method according to claim 1, wherein a sum of the PTAT current and the CTAT current is a constant.

4. The method according to claim 1, wherein an oscillating period corresponding to the generated oscillating frequency is inversely proportional to temperature.

5. The method according to claim 1, wherein the method is applied to a low power operation mode.

6. The method according to claim 1, wherein the plurality of transistors are metal oxide semiconductor transistors.

7. The method according to claim 1, wherein the plurality of transistors are bipolar junction transistors.

* * * * *